US012622293B2

(12) United States Patent
Tu et al.

(10) Patent No.: US 12,622,293 B2
(45) Date of Patent: May 5, 2026

(54) SEMICONDUCTOR DEVICE

(71) Applicant: Taiwan Semiconductor Manufacturing Company, Ltd., Hsinchu (TW)

(72) Inventors: Meng-Che Tu, Hsinchu (TW); Po-Nan Yeh, Hsinchu (TW); Miao-Ken Hung, Hsinchu (TW); Po-Han Wang, Hsinchu (TW); Yu-Hsiang Hu, Hsinchu (TW); Hung-Jui Kuo, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 640 days.

(21) Appl. No.: 18/098,960

(22) Filed: Jan. 19, 2023

(65) Prior Publication Data

US 2024/0186257 A1 Jun. 6, 2024

Related U.S. Application Data

(60) Provisional application No. 63/429,304, filed on Dec. 1, 2022.

(51) Int. Cl.
H01L 23/538 (2006.01)
H01L 23/00 (2006.01)
(Continued)

(52) U.S. Cl.
CPC ......... H10W 70/614 (2026.01); H10W 20/20 (2026.01); H10W 20/42 (2026.01);
(Continued)

(58) Field of Classification Search
CPC ............. H01L 23/5389; H01L 23/5226; H01L 23/53295; H01L 24/19–20; H01L 2924/18162
See application file for complete search history.

(56) References Cited

U.S. PATENT DOCUMENTS 10,879,199 B2 * 12/2020 Kuo ......................... H01L 24/03
2014/0256126 A1 * 9/2014 Wang ...................... H01L 24/11
438/613

FOREIGN PATENT DOCUMENTS

JP 2002084074 A * 3/2002 ............. H01L 24/19

OTHER PUBLICATIONS

JP 2002084074 A—Machine English Translation (Year: 2025).*

* cited by examiner

*Primary Examiner* — Jose R Diaz
(74) *Attorney, Agent, or Firm* — Birch, Stewart, Kolasch & Birch, LLP

(57) ABSTRACT

According to one embodiment, a semiconductor device is provided. The semiconductor device includes a first semiconductor module, a redistribution layer (RDL) module and a second semiconductor module. The RDL module is disposed on the first semiconductor module. The RDL module includes a plurality of polymer layers and a plurality of vias. The polymer layers are stacked on the first semiconductor module. The vias are disposed within the polymer layers. The second semiconductor module is disposed on the RDL module. A height difference of a top surface of at least one of the polymer layers ranges from 0 um to 1 um; or an angle between a sidewall and a bottom surface of at least one of the vias ranges from 90° to 95°; or a glass transition temperature (Tg) of at least one of the polymer layers is larger than 260° C.

20 Claims, 6 Drawing Sheets

(51) Int. Cl.
    *H01L 23/48*        (2006.01)
    *H01L 23/522*     (2006.01)
    *H10W 20/20*     (2026.01)
    *H10W 20/42*     (2026.01)
    *H10W 70/09*     (2026.01)
    *H10W 70/60*     (2026.01)
    *H10W 72/90*     (2026.01)
    *H10W 74/10*     (2026.01)

(52) U.S. Cl.
    CPC ........ *H10W 70/09* (2026.01); *H10W 72/9413*
            (2026.01); *H10W 74/142* (2026.01)

100

100

VA4
A4
A3
A2
A1

PM5
PM4
PM3
VA3
PM2
VA2
PM1
VA1
PM0

100

100

SEMICONDUCTOR DEVICE

PRIORITY CLAIM AND CROSS-REFERENCE

This application claims the benefit of U.S. provisional application Ser. No. 63/429,304, filed Dec. 1, 2022, the subject matter of which is incorporated herein by reference.

BACKGROUND

The disclosure relates in general to a semiconductor device, and more particularly to a semiconductor device having polymer layers.

With the development of semiconductor technology, more than two semiconductor modules may be integrated via advanced packaging technologies. For example, a plurality of conductive traces embedded in polymers are used to connect the semiconductor modules.

However, the advanced packaging technology often suffers a polymer delamination issue. After some high temperature process, such as annealing or curing, the polymer might be separated from the metal traces. The researchers are trying to solve this problem.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
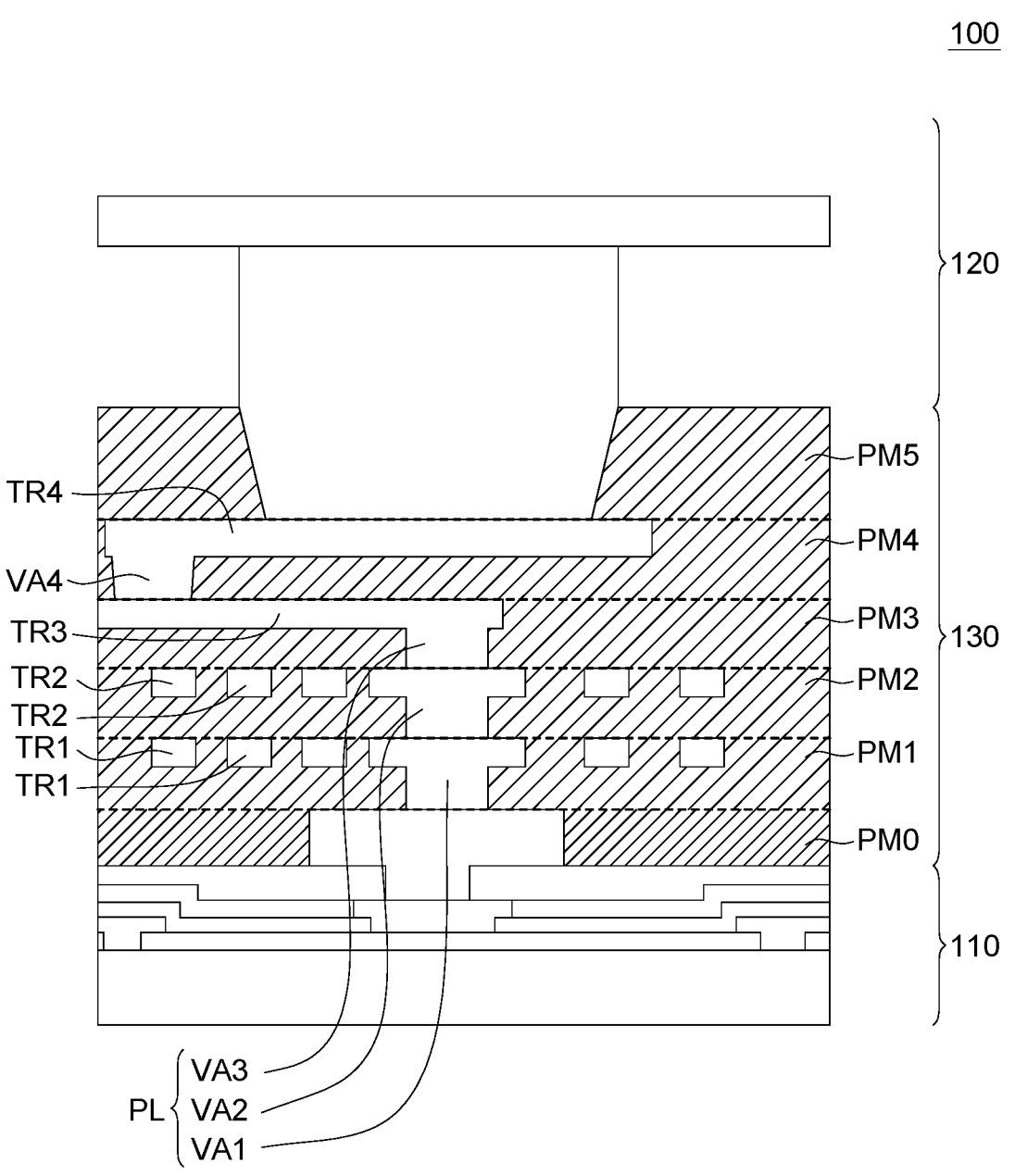
FIG. 1 shows a semiconductor device according to one embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Please refer to FIG. 1, which shows a semiconductor device 100 according to one embodiment. The semiconductor device 100 includes a first semiconductor module 110, a second semiconductor module 120 and a redistribution layer (RDL) module 130. The first semiconductor module 110 is, for example, a chip or a memory. The second semiconductor module 120 is, for example, a package, a chip, a memory or a substrate. The RDL module 130 is used to fan out the traces for integrating the first semiconductor module 110 and the second semiconductor module 120.

As shown in FIG. 1, the RDL module 130 is disposed on the first semiconductor module 110. For example, the RDL module 130 could be bonded with the first semiconductor module 110 through copper bumps. Or, the RDL module 130 could be directly formed on the first semiconductor module 110 in way of layer by layer.

The second semiconductor module 120 is disposed on the RDL module 130. The second semiconductor module 120 could be bonded with the RDL module 130. Or, the second semiconductor module 120 could be jointed with the RDL module 130 through solder balls.

The RDL module 130 includes, for example, a plurality of polymer layers PM0, PM1, PM2, PM3, PM4, PM5, a plurality of vias VA1, VA2, VA3, VA4 and a plurality of traces TR1, TR2, TR3, TR4. The polymer layers PM0, PM1, PM2, PM3, PM4, PM5 are stacked on the first semiconductor module 110. The vias VA1, VA2, VA3, VA4 are disposed within the polymer layers PM0, PM1, PM2, PM3, PM4, PM5. The vias VA1, VA2, VA3 are stacked to form a pillar PL.

Figure 2:
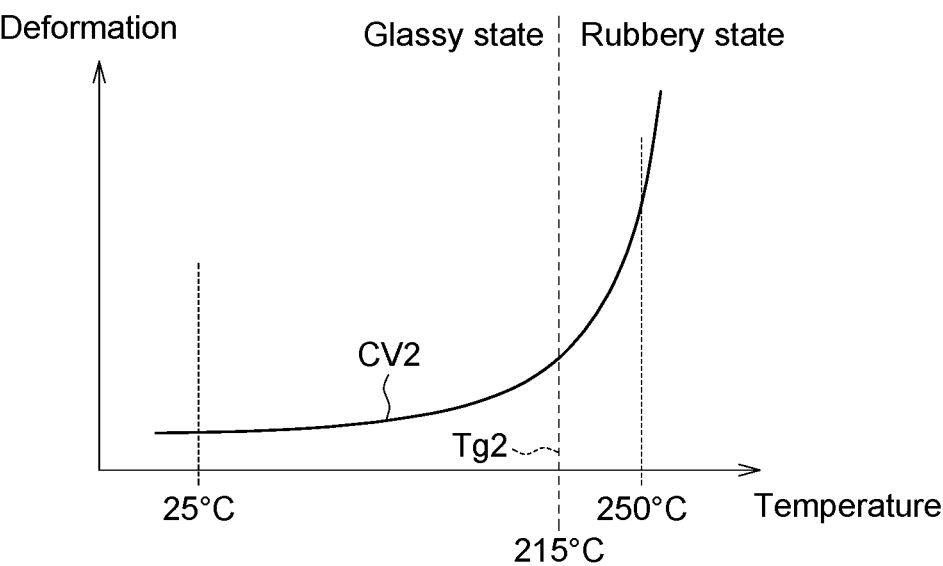
FIG. 2 shows a deformation curve of one polymer layer having low glass transition temperature.

Please refer to FIG. 2, which shows a deformation curve CV2 of one polymer layer having low glass transition temperature Tg2. For example, the low glass transition temperature Tg2 is lower than 220° C. The glass transition temperature is the temperature at which a polymer turns from a glassy state to a rubbery state. The deformation curve CV2 is measured by thermal mechanical analysis. As shown in the deformation curve CV2, when the temperature raises from 25° C. to 250° C., the deformation is large. Therefore, if the polymer layer having low glass transition temperature Tg2 is processed some high temperature processes, such as annealing, or curing, this polymer layer would be changed to the rubbery state and would be greatly deformed. In case of the polymer layer is greatly deformed, the vias and the traces located therein would be shifted, and the polymer layer is easily separated from the vias, or the traces.

Figure 3:
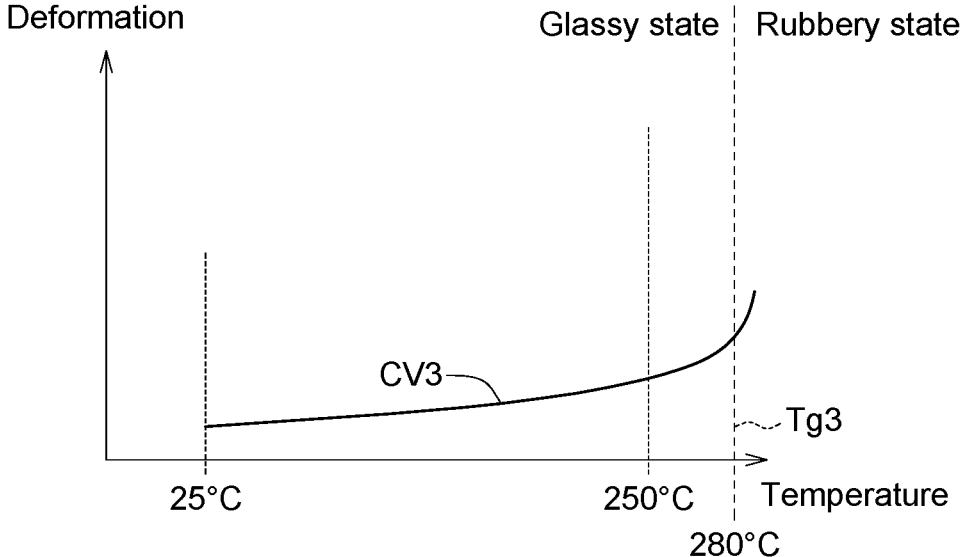
FIG. 3 shows a deformation curve of one polymer layer having high glass transition temperature.

Please refer to FIG. 3, which shows a deformation curve CV3 of one polymer layer having high glass transition temperature Tg3. For example, the high glass transition temperature Tg3 is larger than 260° C. As shown in the deformation curve CV3, when the temperature raises from 25° C. to 250° C., the deformation is small. Therefore, if the polymer layer having high glass transition temperature Tg3 is processed some high temperature processes, such as annealing, or curing, this polymer layer would be kept at the glassy state and would not be greatly deformed.

In the present embodiment, the RDL module 130 includes five polymer layers PM0, PM1, PM2, PM3, PM4, PM5. Usually, the polymer delamination is often happened at the polymer layers PM1, PM2, PM3, PM4, PM5, which are not the bottom layer. Therefore, to prevent from the polymer delamination, the polymer layers PM1, PM2, PM3, PM4, PM5 are designed to have the high glass transition temperature Tg3. The polymer layer PM0 could have the low glass transition temperature Tg2. In another embodiment, polymer layer PM0 could have the high glass transition temperature Tg3.

In case of the polymer layer PM0 has the low glass transition temperature Tg2, the composition of the polymer layers PM1, PM2, PM3, PM4, PM5 and the compositions of the polymer layer PM0 are different.

Through countless trials, the researchers found that if each of the polymer layers PM1, PM2, PM3, PM4, PM5 includes 10% to 20% of polyimide and 0% to 0.5% of epoxy, the polymer layers PM1, PM2, PM3, PM4, PM5 would have high glass transition temperature Tg3. If the polymer layer PM0 includes 25% to 35% of polyimide and 0% to 5% of crosslinked material, the polymer layer PM0 would have low glass transition temperature Tg2.

Figure 4:
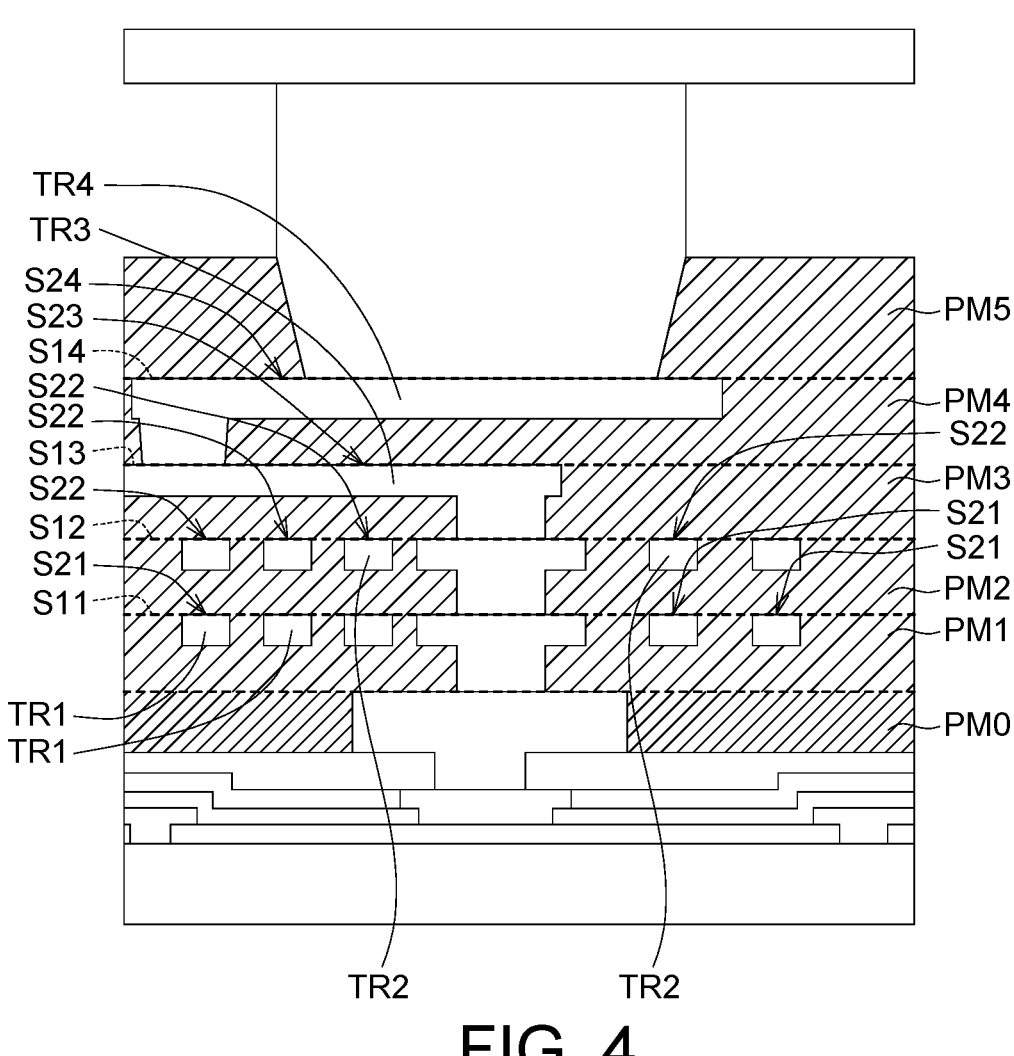
FIG. 4 illustrates one characteristic of the semiconductor device.

Please refer to FIG. 4, which illustrates one characteristic of the semiconductor device 100. Because the polymer layer PM1 would be kept at the glassy state and would not be greatly deformed, so a top surface S11 of the polymer layer PM1 is substantially flat. In particular, a height difference of the top surface S11 of the polymer layer PM1 ranges from 0 um to 1 um. Further, the surfaces S21 of the traces TR1 are substantially located at the same plane. In particular, a height difference of the surfaces S21 of the traces TR1 ranges from 0 um to 1 um.

Because the polymer layers PM1, PM2 would be kept at the glassy state and would not be greatly deformed, so a top surface S12 of the polymer layer PM2 is substantially flat. In particular, a height difference of the top surface S12 of the polymer layer PM2 ranges from 0 um to 1 um. Further, the surfaces S22 of the traces TR2 are substantially located at the same plane. In particular, a height difference of the surfaces S22 of the traces TR2 ranges from 0 um to 1 um.

Because the polymer layers PM1, PM2, PM3 would be kept at the glassy state and would not be greatly deformed, so a top surface S13 of the polymer layer PM3 is substantially flat. In particular, a height difference of the top surface S13 of the polymer layer PM3 ranges from 0 um to 1 um. Further, the top surface S23 of the trace TR3 is substantially located at the same plane. In particular, a height difference of the top surface S23 of the trace TR3 ranges from 0 um to 1 um.

Because the polymer layers PM1, PM2, PM3, PM4 would be kept at the glassy state and would not be greatly deformed, so a top surface S14 of the polymer layer PM4 is substantially flat. In particular, a height difference of the top surface S14 of the polymer layer PM4 ranges from 0 um to 1 um. Further, the top surface S24 of the trace TR4 is substantially located at the same plane. In particular, a height difference of the top surface S24 of the trace TR4 ranges from 0 um to 1 um.

Figure 5:
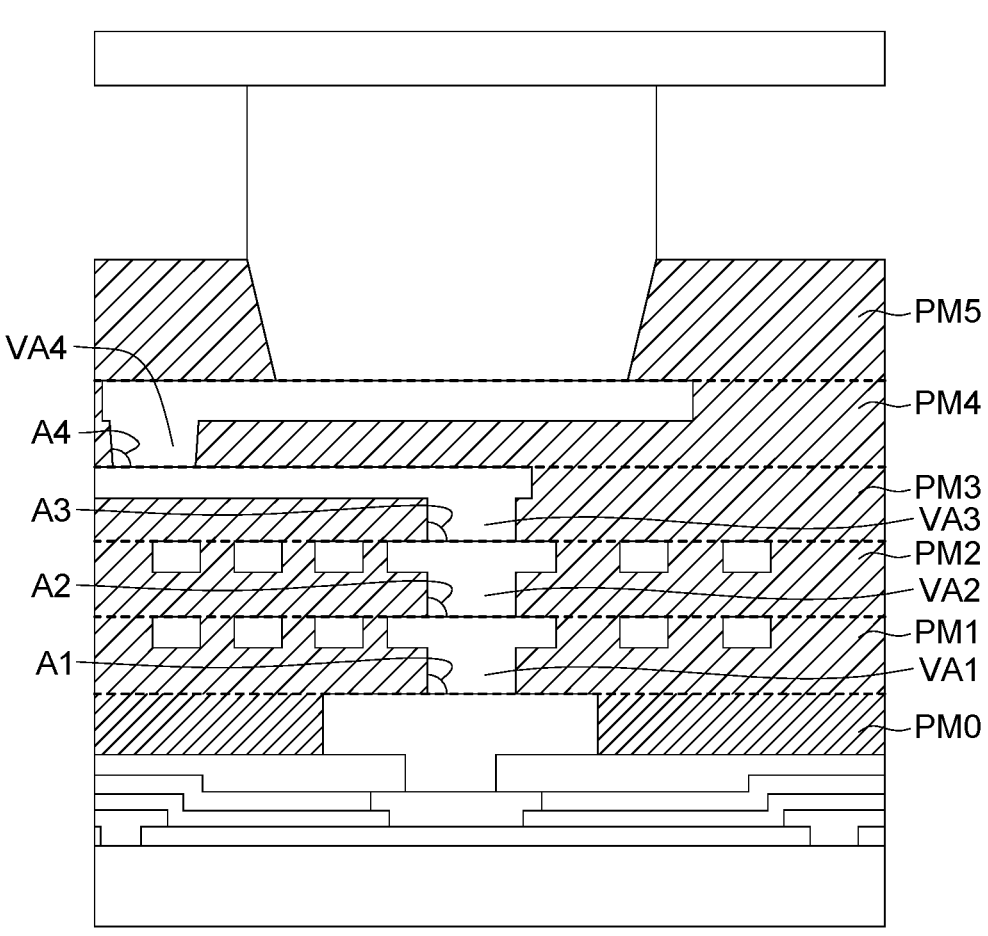
FIG. 5 illustrates another characteristic of the semiconductor device.

Please refer to FIG. 5, which illustrates another characteristic of the semiconductor device 100. Because the polymer layer PM1 would be kept at the glassy state and would not be greatly deformed, so the via VA1 would not be shifted or swung. A sidewall of the via VA1 could be fixed at vertical direction. In particular, an angle A1 between the sidewall and a bottom surface of the via VA1 ranges from 90 to 95.

Because the polymer layers PM1, PM2 would be kept at the glassy state and would not be greatly deformed, so the via VA2 would not be shifted or swung. A sidewall of the via VA2 could be fixed at vertical direction. In particular, an angle A2 between the sidewall and a bottom surface of the via VA2 ranges from 90 to 95.

Because the polymer layers PM1, PM2, PM3 would be kept at the glassy state and would not be greatly deformed, so the via VA3 would not be shifted or swung. A sidewall of the via VA3 could be fixed at vertical direction. In particular, an angle A3 between the sidewall and a bottom surface of the via VA3 ranges from 90 to 95.

Because the polymer layers PM1, PM2, PM3, PM4 would be kept at the glassy state and would not be greatly deformed, so the via VA4 would not be shifted or swung. A sidewall of the via VA4 could be fixed at vertical direction. In particular, an angle A4 between the sidewall and a bottom surface of the via VA4 ranges from 90 to 95.

Figure 6:
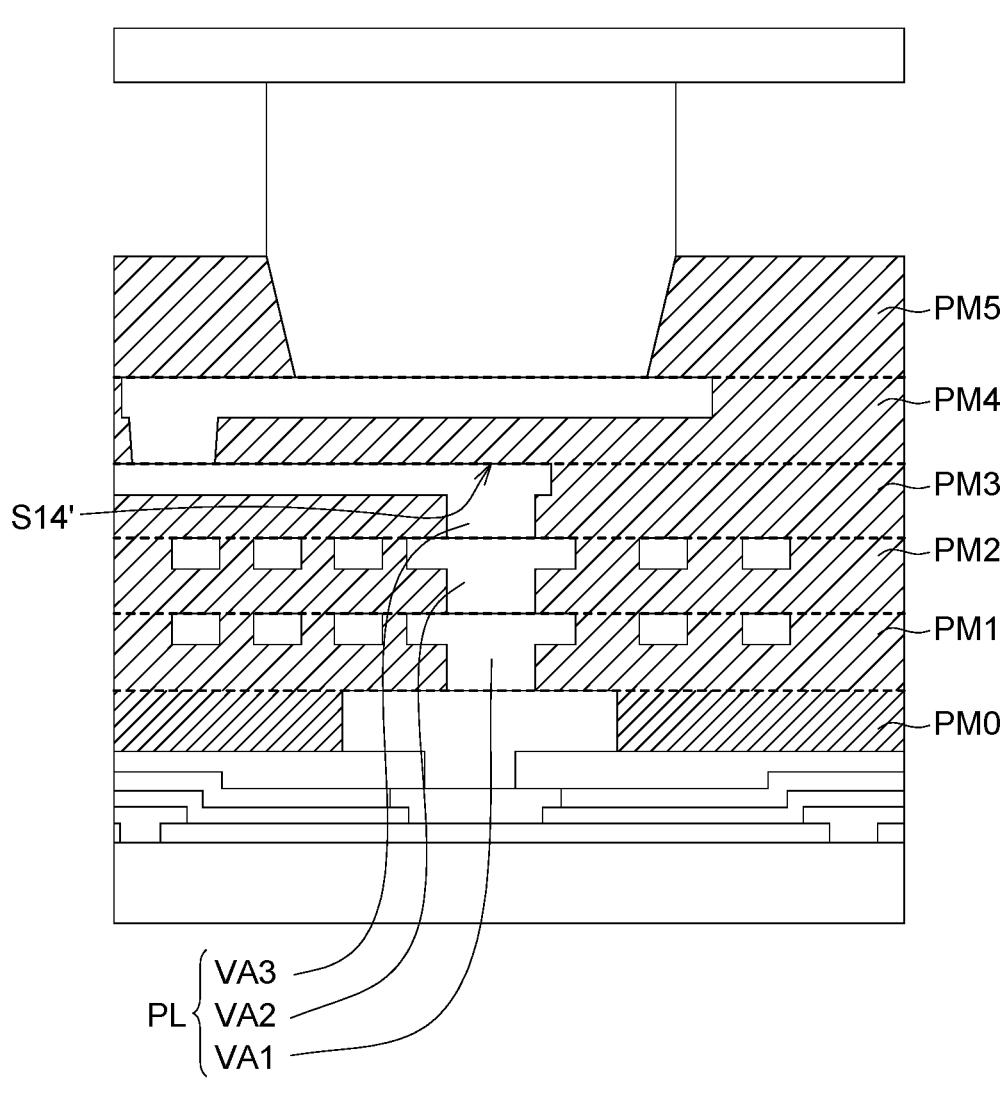
FIG. 6 illustrates another characteristic of the semiconductor device.

Please refer to FIG. 6, which illustrates another characteristic of the semiconductor device 100. The vias VA1, VA2, VA3 are stacked to form the pillar PL. Because the polymer layers PM1, PM2, PM3, PM4 would be kept at the glassy state and would not be greatly deformed, so the pillar PL would not be swung. A top of the pillar PL is covered by the polymer layer PM4. A bottom surface S14' of the polymer layer PM4 is substantially flat and the top of the pillar PL is fully contacted with the bottom surface S14' of the polymer layer PM4.

Figure 7:
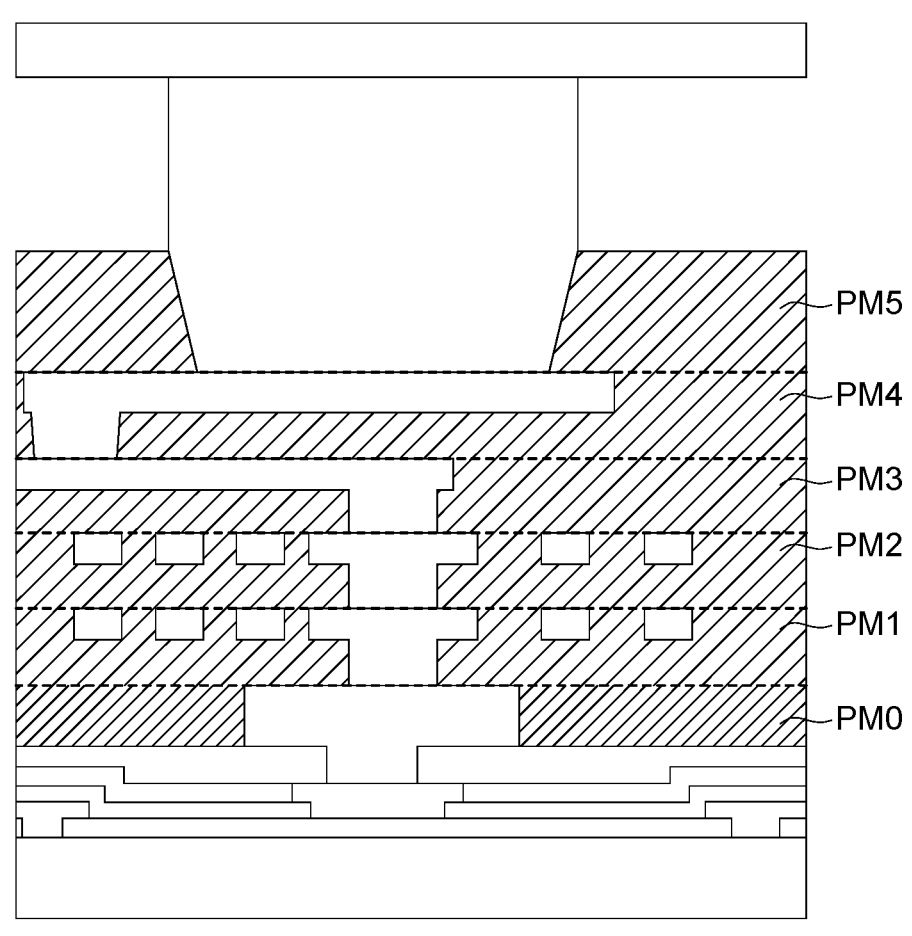
FIG. 7 illustrates another characteristic of the semiconductor device.

Please refer to FIG. 7, which illustrates another characteristic of the semiconductor device 100. The composition of the polymer layers PM1, PM2, PM3, PM4, PM5 and the composition of the polymer layer PM0 are different. For a light whose wavelength ranges from 500 nm to 700 nm, a light transmittance of the polymer layers PM1, PM2, PM3, PM4, PM5 is larger than that of the polymer layer PM0. In particular, the light transmittance of the polymer layers PM1, PM2, PM3, PM4, PM5 for the light whose wavelength ranges from 500 nm to 700 nm is larger 95%; the light transmittance of the polymer layer PM0 for the light whose wavelength ranges from 500 nm to 700 nm is just larger 92%.

Based on above, at least one the polymer layer having high glass transition temperature would be kept at the glassy state and would not be greatly deformed, and the vias and the traces located therein would not be shifted or swung. Therefore, the polymer layers, the vias and the traces can be firmly contacted with each other without any polymer delamination.

According to one embodiment, a semiconductor device is provided. The semiconductor device includes a first semiconductor module, a redistribution layer (RDL) module and a second semiconductor module. The RDL module is disposed on the first semiconductor module. The RDL module includes a plurality of polymer layers and a plurality of vias. The polymer layers are stacked on the first semiconductor module. The vias are disposed within the polymer layers. A height difference of a top surface of at least one of the polymer layers ranges from 0 um to 1 um. The second semiconductor module is disposed on the RDL module.

According to another embodiment, a semiconductor device is provided. The semiconductor device includes a first semiconductor module, a redistribution layer (RDL) module and a second semiconductor module. The RDL module is disposed on the first semiconductor module. The RDL module includes a plurality of polymer layers and a plurality of vias. The polymer layers are stacked on the first semiconductor module. The vias are disposed within the polymer layers. An angle between a sidewall and a bottom surface of at least one of the vias ranges from 90° to 95°. The second semiconductor module is disposed on the RDL module.

According to an alternative embodiment, a semiconductor device is provided. The semiconductor device includes a first semiconductor module, a first semiconductor module and a second semiconductor module. The RDL module is disposed on the first semiconductor module. The RDL module includes a plurality of polymer layers and a plurality of vias. The polymer layers are stacked on the first semiconductor module. The vias are disposed within the polymer layers. A glass transition temperature (Tg) of at least one of the polymer layers is larger than 260° C. The second semiconductor module is disposed on the RDL module.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first semiconductor module;
a redistribution layer (RDL) module, disposed on the first semiconductor module, wherein the RDL module includes:
    a plurality of polymer layers, stacked on the first semiconductor module; and
    a plurality of vias, disposed within the polymer layers, wherein a height difference of a top surface of at least one of the polymer layers ranges from 0 µm to 1 µm; and
a second semiconductor module, disposed on the RDL module;
wherein a light transmittance of at least one of the polymer layers for a light with a wavelength ranging from 500 nm to 700 nm is larger than 95%.

2. The semiconductor device according to claim 1, wherein an angle between a sidewall and a bottom surface of at least one of the vias ranges from 90° to 95°.

3. The semiconductor device according to claim 1, wherein a glass transition temperature (Tg) of at least one of the polymer layers is larger than 260° C.

4. The semiconductor device according to claim 1, wherein at least one of the polymer layers includes 10% to 20% of polyimide and 0% to 0.5% of epoxy.

5. The semiconductor device according to claim 1, wherein compositions of at least two of the polymer layers are different.

6. The semiconductor device according to claim 1, wherein at least one of the polymer layers includes 10% to 20% of polyimide and 0% to 0.5% of epoxy and one of the polymer layers includes 25% to 35% of polyimide and 0% to 5% of crosslinked material.

7. The semiconductor device according to claim 1, wherein at least two of the vias are stacked to form a pillar, a top of the pillar is covered by one of the polymer layers whose bottom surface is substantially flat.

8. The semiconductor device according to claim 1, wherein the polymer layers have different glass transition temperatures.

9. A semiconductor device, comprising:
a first semiconductor module;
a redistribution layer (RDL) module, disposed on the first semiconductor module, wherein the RDL module includes:
    a plurality of polymer layers, stacked on the first semiconductor module; and
    a plurality of vias, disposed within the polymer layers, wherein an angle between a sidewall and a bottom surface of at least one of the vias ranges from 90° to 95°; and
a second semiconductor module, disposed on the RDL module;
wherein at least one of the polymer layers includes 10% to 20% of polyimide and 0% to 0.5% of epoxy and one of the polymer layers includes 25% to 35% of polyimide and 0% to 5% of crosslinked material.

10. The semiconductor device according to claim 9, wherein a glass transition temperature (Tg) of at least one of the polymer layers is larger than 260° C.

11. The semiconductor device according to claim 9, wherein a light transmittance of at least one of the polymer layers for a light whose wavelength ranges from 500 nm to 700 nm is larger 95%.

12. The semiconductor device according to claim 9, wherein at least one of the polymer layers includes 10% to 20% of polyimide and 0% to 0.5% of epoxy.

13. The semiconductor device according to claim 9, wherein materials of at least two of the polymer layers are different.

14. The semiconductor device according to claim 9, wherein at least two of the vias are stacked to form a pillar, a top of the pillar is cover one of the polymer layers whose bottom surface is substantially flat.

15. The semiconductor device according to claim 9, wherein the polymer layers have different glass transition temperatures.

16. A semiconductor device, comprising:
a first semiconductor module;
a redistribution layer (RDL) module, disposed on the first semiconductor module, wherein the RDL module includes:
    a plurality of polymer layers, stacked on the first semiconductor module; and
    a plurality of vias, disposed within the polymer layers, wherein a glass transition temperature (Tg) of at least one of the polymer layers is larger than 260° C.; and
a second semiconductor module, disposed on the RDL module;
wherein a light transmittance of at least one of the polymer layers for a light with a wavelength ranging from 500 nm to 700 nm is larger than 95%.

17. The semiconductor device according to claim 16, wherein at least one of the polymer layers includes 10% to 20% of polyimide and 0% to 0.5% of epoxy.

18. The semiconductor device according to claim 16, wherein materials of at least two of the polymer layers are different.

19. The semiconductor device according to claim 16, wherein at least two of the vias are stacked to form a pillar, a top of the pillar is covered by one of the polymer layers whose bottom surface is substantially flat.

20. The semiconductor device according to claim 16, wherein the polymer layers have different glass transition temperatures.

\* \* \* \* \*